(12) United States Patent
Mankin et al.

(10) Patent No.: US 9,548,180 B2
(45) Date of Patent: Jan. 17, 2017

(54) NANOPARTICLE-TEMPLATED LITHOGRAPHIC PATTERNING OF NANOSCALE ELECTRONIC COMPONENTS

(71) Applicant: Elwha LLC, Bellevue, WA (US)

(72) Inventors: Max N. Mankin, Seattle, WA (US); Tony S. Pan, Bellevue, WA (US)

(73) Assignee: ELWHA LLC, Bellevue, WA (US)

( * ) Notice: Subject to any disclaimer, the term of this patent is extended or adjusted under 35 U.S.C. 154(b) by 0 days.

(21) Appl. No.: 14/947,773

(22) Filed: Nov. 20, 2015

(65) Prior Publication Data

US 2016/0181051 A1 Jun. 23, 2016

Related U.S. Application Data

(60) Provisional application No. 62/082,768, filed on Nov. 21, 2014.

(51) Int. Cl.
| | |
|---|---|
| *H01J 1/308* | (2006.01) |
| *H01J 9/02* | (2006.01) |
| *H01J 1/304* | (2006.01) |
| *H01L 31/0352* | (2006.01) |
| *H01L 21/3065* | (2006.01) |

(52) U.S. Cl.
CPC ............. *H01J 9/025* (2013.01); *H01J 1/3044* (2013.01); *H01J 2201/30411* (2013.01); *H01J 2201/30469* (2013.01); *H01J 2201/30492* (2013.01); *H01J 2209/0223* (2013.01); *H01J 2237/06341* (2013.01); *H01L 21/3065* (2013.01); *H01L 31/0352* (2013.01)

(58) Field of Classification Search
CPC ............ H01J 9/025; H01J 1/304; H01J 3/022; H01J 2201/30403; H01J 2329/00; H01J 2201/319;H01J 2209/0223; H01J 1/3044; H01J 2201/30469; H01J 2237/06341; B82Y 30/00; B82Y 10/00; B82Y 15/00; H01L 29/0665; H01L 21/0331; H01L 21/0337; H01L 21/3065; H01L 31/0352; Y10S 977/811; Y10S 977/938; C30B 29/605
USPC .......................................... 438/20
See application file for complete search history.

(56) References Cited

U.S. PATENT DOCUMENTS

| | | | |
|---|---|---|---|
| 4,200,555 A * | 4/1980 | Joy ..................... | C04B 35/5156 252/519.14 |
| 5,865,657 A * | 2/1999 | Haven ..................... | H01J 9/025 445/24 |
| 8,575,842 B2 | 11/2013 | Hyde et al. | |
| 2004/0198850 A1* | 10/2004 | Connor ................. | B29C 67/202 521/50 |
| 2005/0224779 A1* | 10/2005 | Wang ..................... | B82Y 10/00 257/9 |
| 2007/0120482 A1* | 5/2007 | Michael ............. | H01J 61/0677 313/568 |

(Continued)

OTHER PUBLICATIONS

PCT International Search Report; International App. No. PCT/US2015/060384; Feb. 22, 2016; pp. 1-5.

*Primary Examiner* — Caleen Sullivan

(57) ABSTRACT

Some embodiments of vacuum electronics call for nanoscale field-enhancing geometries. Methods and apparatus for using nanoparticles to fabricate nanoscale field-enhancing geometries are described herein. Other embodiments of vacuum electronics call for methods of controlling spacing between a control grid and an electrode on a nano- or micron-scale, and such methods are described herein.

35 Claims, 22 Drawing Sheets

(56) References Cited

U.S. PATENT DOCUMENTS

2009/0189138 A1 7/2009 Lung et al.

* cited by examiner

FIG. 7
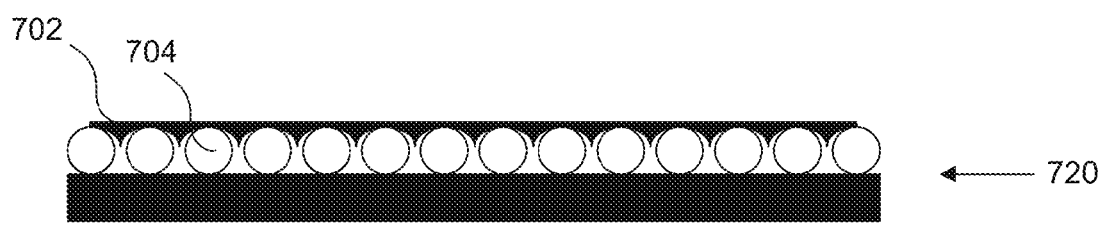
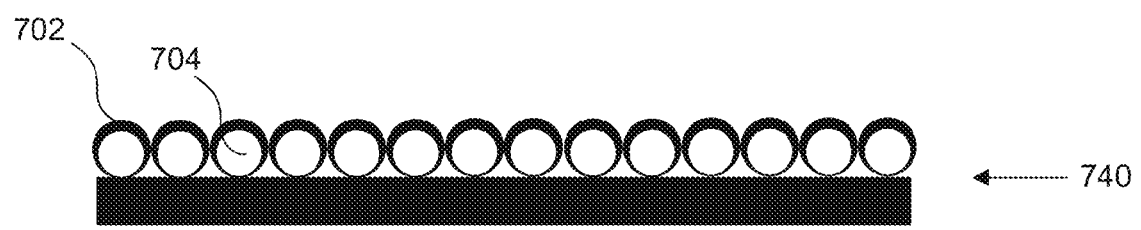

NANOPARTICLE-TEMPLATED LITHOGRAPHIC PATTERNING OF NANOSCALE ELECTRONIC COMPONENTS

PRIORITY APPLICATIONS

The present application claims benefit of priority of U.S. Provisional Patent Application No. 62/082,768, entitled NANOPARTICLE-TEMPLATED VERSATILE LITHOGRAPHIC PATTERNING OF NANOSCALE VACUUM ELECTRONIC COMPONENTS, naming MAX N. MANKIN AND TONY S. PAN as inventors, filed 21, Nov. 2014, which was filed within the twelve months preceding the filing date of the present application or is an application of which a currently co-pending priority application is entitled to the benefit of the filing date.

If an Application Data Sheet (ADS) has been filed on the filing date of this application, it is incorporated by reference herein. Any applications claimed on the ADS for priority under 35 U.S.C. §§119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)).

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

SUMMARY

In one embodiment, a method of forming an array of field emitters on a substrate comprises: assembling an array of nanoparticles on the substrate; and depositing a material on the array of nanoparticles to form the array of field emitters.

In another embodiment, a method of forming an array of field emitters on a substrate comprises: assembling an array of nanoparticles on the substrate, wherein the assembled array of nanoparticles forms an etch mask; etching the substrate according to the etch mask; and depositing an electron-emissive material on the etched substrate to form an array of field emitters.

In another embodiment, a method comprises: assembling a superlattice of nanoparticles on a substrate; depositing a film on each of the nanoparticles in the superlattice; etching the nanoparticles in the superlattice to produce an inverse opal; and cleaving the inverse opal to produce an array of field emitters.

In another embodiment, a method comprises: fabricating an array of nanoscale field emitters on a substrate; depositing a layer of dielectric material on the nanoscale field emitters; and depositing a grid on the layer of dielectric material, wherein a distance between the nanoscale field emitters and the grid is on a sub-micron scale.

In another embodiment, a method comprises: fabricating an array of nanoscale field emitters on a substrate; depositing a layer of dielectric material on the nanoscale field emitters; depositing a sacrificial layer on the layer of dielectric material; and depositing a grid on the sacrificial layer, wherein a distance between the nanoscale field emitters and the grid is on a sub-micron scale.

In another embodiment, a method comprises: depositing a resist on a substrate; patterning the resist by removing portions of the resist in a series of regions; depositing a dielectric material on the substrate in the series of regions in which the resist has been removed; removing the resist; and depositing a grid on the dielectric material, wherein a distance between the substrate and the grid is on a sub-micron scale.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 7 is a schematic of examples of a film sputtered or CVD-grown on nanoparticles.

DETAILED DESCRIPTION

Figure 1:
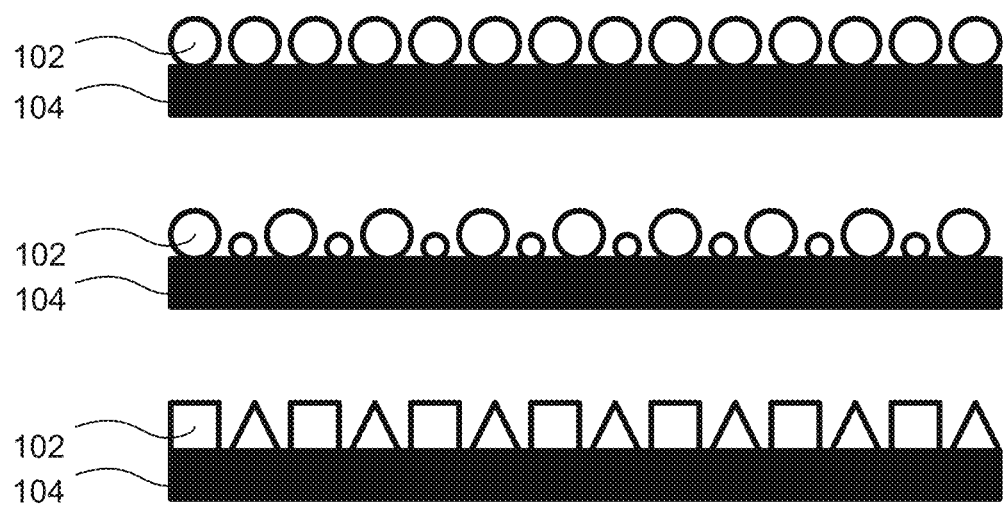
FIG. 1 is a schematic of cross sections of nanoparticles on a substrate.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Some embodiments of vacuum electronics call for nanoscale field-enhancing geometries. Methods and apparatus for using nanoparticles to fabricate nanoscale field-enhancing geometries (i.e., electron emitters) are described herein. Other embodiments of vacuum electronics call for methods of controlling spacing between a control grid and an electrode on a nano- or micron-scale, and such methods are described herein.

In many vacuum electronic devices, charged particle flux to or from emitters (henceforth known as cathodes) or collectors (anodes) is modulated by a grid (e.g. control grid) positioned some distance (from nm to macroscale) from an electrode. One example of such an embodiment is described in U.S. Pat. No. 8,575,842 to Hyde et al. entitled FIELD EMISSION DEVICE, which is incorporated herein by reference. The distance between the electrode and grid influences the performance of such devices. Methods and apparatus for positioning a grid within sub-micron distances from an electrode and/or from field enhancing features on the electrode are described herein.

Many techniques as described herein employ nanosphere lithography, which involves casting layers of nanoparticles on a substrate and using them as a mask for subsequent etching or deposition. Though many of the figures included herein depict cross sections of close-packed 2D monolayers of spherical nanoparticles for simplicity, the descriptions herein are general to size, morphology, and composition of nanoparticles as well as the geometry of the nanoparticle mask. The techniques described herein involving nanoparticles are not limited to single layers of spherical NWs of uniform composition and size. Generally, the spacing between particles is tunable by, for example, adjusting their surface coatings, by post-deposition etching of the particles to smaller size (for example, oxygen plasma etching of polystyrene nanoparticles), or by other means. Nanoparticles can be of various morphologies, including spheres, rods, tetrapods, wires, "dogbones", nanoboxes, nanocages, dendrites, cubes, polyhedra, discs, platelets, nanoreefs, nanostars, etc. Nanoparticles can also be of various compositions, including polystyrene, quantum dots, gold (Au), silicon (Si), etc. Oriented or randomly assembled nanowires, nanocubes, carbon nanomaterials, etc. of different sizes, morphologies, and materials, for example, afford a vast possibility of potential geometries. This rich range of possibilities for assembly, deposition and fabrication methods, nanoparticle size, nanoparticle surface coating, nanoparticle morphology, nanoparticle composition yields a multitude of unique field enhancing geometries, examples of which are described herein.

While 'nanosphere lithography' indicates that the nanoparticles serve as templates for etching and/or deposition of substrate/electrode materials (e-absorbers and emitters), grid materials, etc., nanoparticles of appropriate composition can themselves serve as field enhancers or spacers between grids and electrodes given their inherent nanoscale dimensions and radii of curvature.

Figure 2:
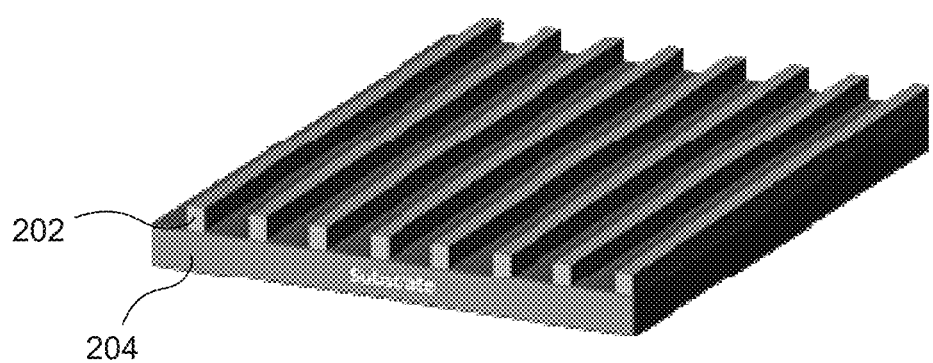
FIG. 2 is a schematic of a 3D view of nanowires on a substrate.

For illustrative purposes, examples of assemblies of nanoparticles of various compositions, sizes, and morphologies on a substrate are shown in FIG. 1 and FIG. 2. The assemblies in FIG. 1 are cross sections of assemblies of nanoparticles 102 of various compositions, sizes, and morphologies on a substrate 104. FIG. 2 shows an assembly of nanowires 202 on a substrate 204 in a 3D view. These figures demonstrate just a few examples of the different morphologies of nanoparticles available.

Figure 3:
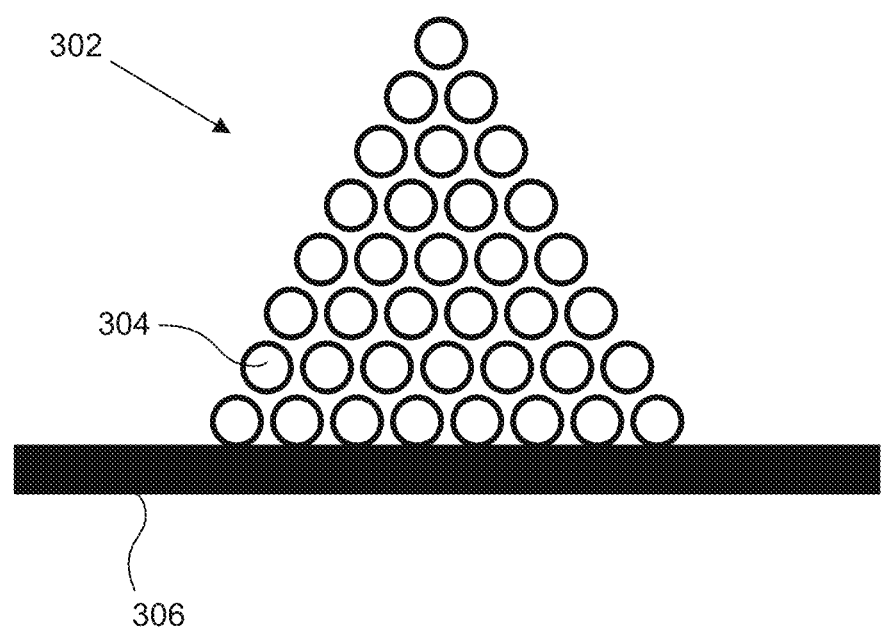
FIG. 3 is a schematic of a superlattice of nanoparticles on a substrate.

In one embodiment of a nanoscale field-enhancing geometries, an example of which is shown in FIG. 3, a superlattice 302 of nanoparticles 304 is assembled on a substrate 306. In some embodiments the structure is assembled by patterning a resist window on the substrate 306, with e.g. photolithography or nano-imprint lithography, wherein the nanoparticles can assemble within this window. In some embodiments the nanoparticles are sintered in place via, for example, a rapid thermal anneal process, which enables facile electron transport between the particles while maintaining the overall superlattice structure. Superlattices 302 of nanoparticles often grow with well-defined crystallography. Superlattices provide an opportunity for hierarchical field enhancement. For instance, the geometry of the individual nanoparticles and the overall morphology of the superlattice can be engineered to have different but complementary effects on field enhancement. For 10 nm diameter nanoparticles, the structure shown in FIG. 3 would be ~60 nm tall with a 5 nm tip radius of curvature.

Figure 4:
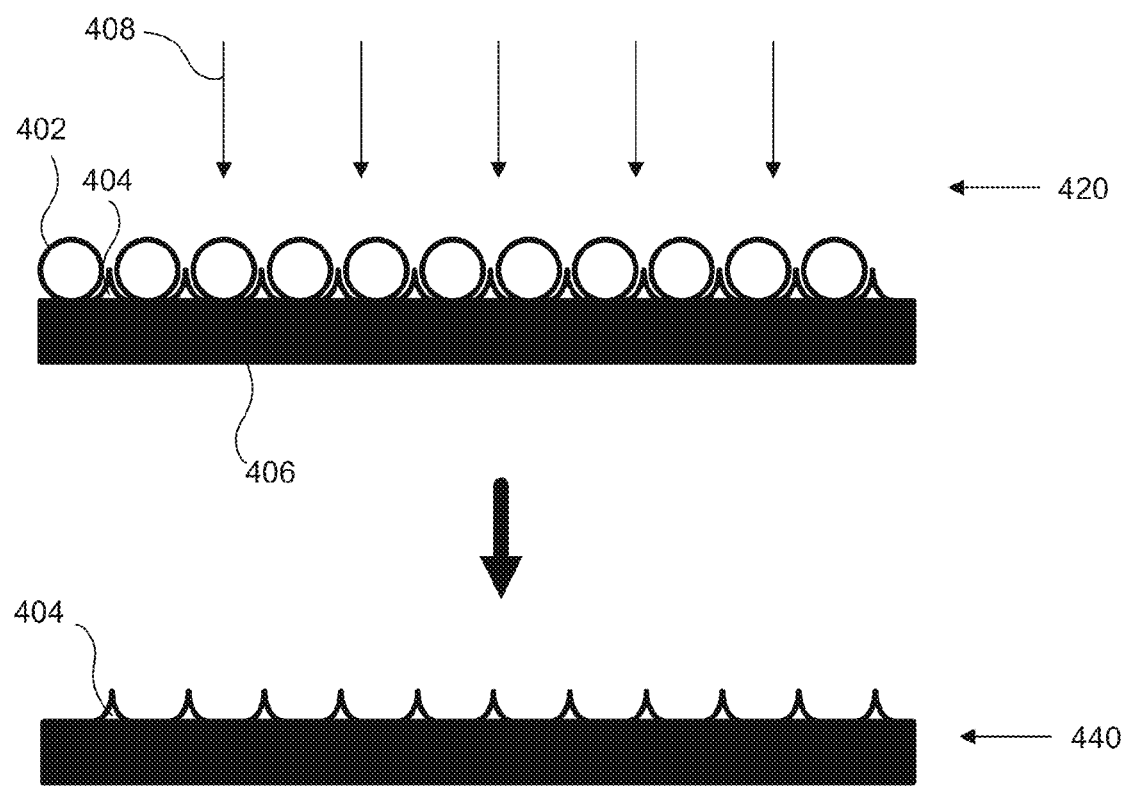
FIG. 4 is a schematic of nanoparticles used as an evaporation mask.

In one embodiment of a method of fabricating nanoscale field-enhancing geometries, shown in FIG. 4, (step 420) nanoparticles 402 are used as an evaporation mask to deposit line-of-sight evaporated material nanotips 404 between the particles on a substrate 406 (the evaporation material is shown symbolically via the arrows 408). Although the particles 402 are shown as being spherical in FIG. 4, in other embodiments the particles are a different shape. As shown in step 440 of FIG. 4, after evaporation of the material, the nanoparticles 402 can be removed by dry or wet etching, milling, mechanical abrasion, solution-phase sonication, or via another technique, or the nanoparticles 402 can be left on the substrate 406. In some embodiments the nanotips 404 created by the evaporated material form field emitters, and in other embodiments the nanotips 404 are coated with an electron emissive material to form the field emitters. For example, in some embodiments the deposited material is gold (Au), titanium (Ti), tungsten (W), tantalum (Ta), or molybdenum (Mo), which is then coated conformally with lanthanum hexaboride ($LaB_6$) or another refractory material. In some embodiments the geometry (for example, the sharpness) of the nanotips 404 on the substrate 406 can be further controlled by varying the angle or rotation of the substrate relative to the incident flux of the material 408.

Figure 5:
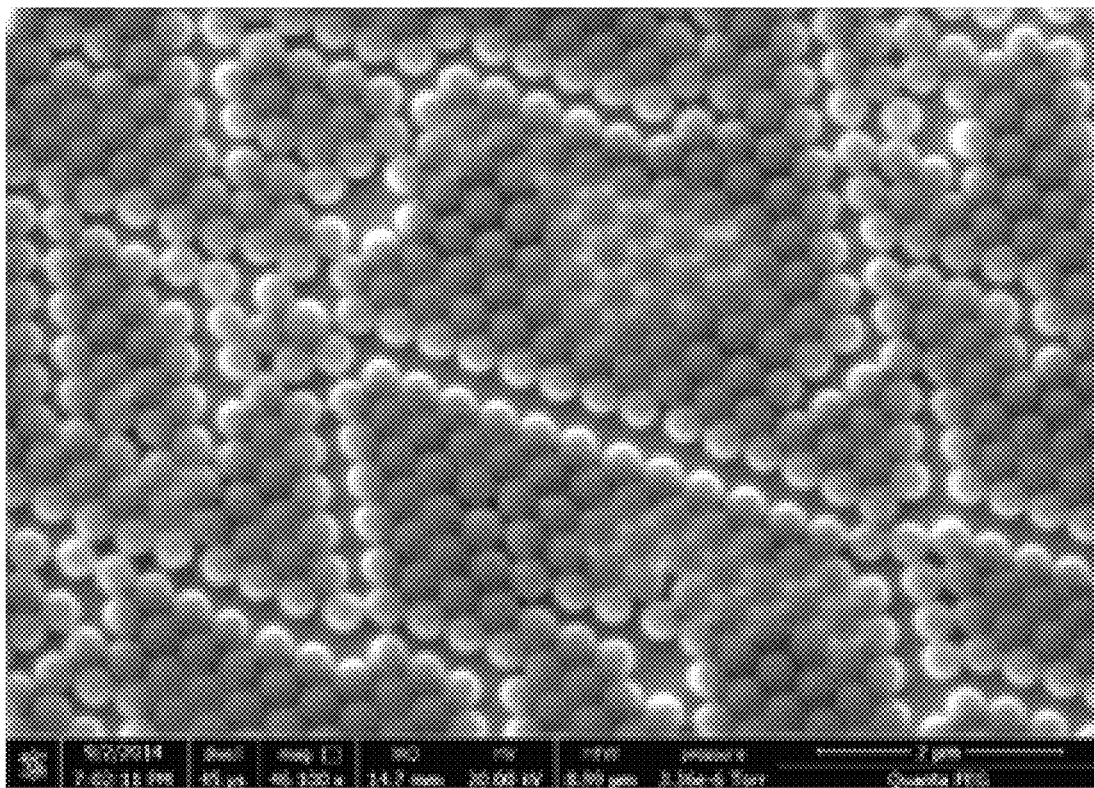
FIG. 5 shows an SEM image of nanoparticles.
Figure 6:
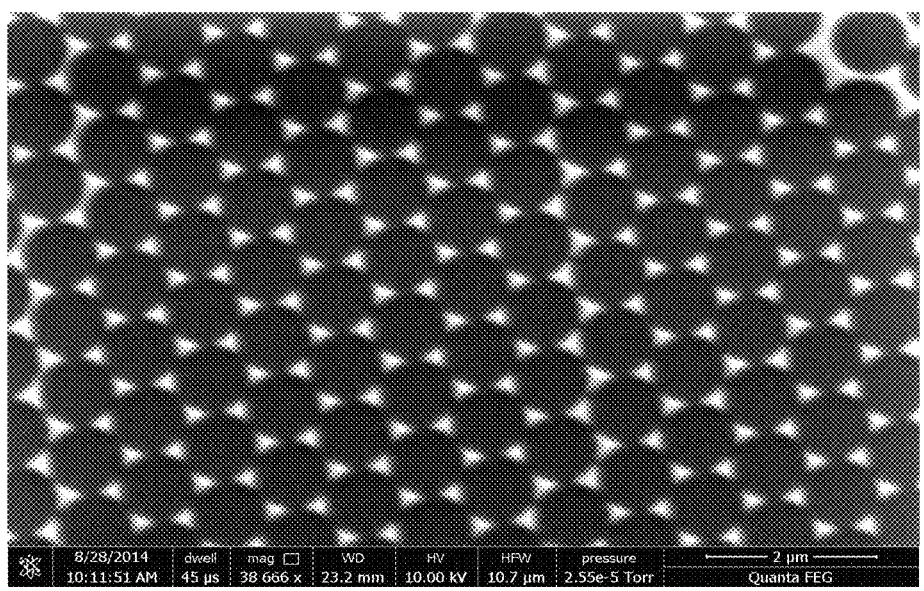
FIG. 6 shows an SEM image of nanotips obtained from the particle mask of FIG. 5.

FIG. 5 shows an SEM image of nanoparticles 402 (here, the particles are spheres) arranged according to step 420 of FIG. 4. FIG. 6 shows the resulting nanotips 404 shown in step 440 of FIG. 4, i.e. after the removal of the nanoparticles 402.

If the evaporation material 408 is deposited by ideal line-of-sight deposition, it will penetrate between the nanoparticles, giving the geometry shown in FIG. 4. In another embodiment, shown in FIG. 7, a film 702 is sputtered or CVD-grown on nanoparticles 704. Depending on the deposition conditions, primarily the pressure in the chamber, as well as the spacing and geometry of the nanoparticles, the film 702 grows in any number of morphologies, examples of which (720, 740) are shown in FIG. 7.

Figure 8:
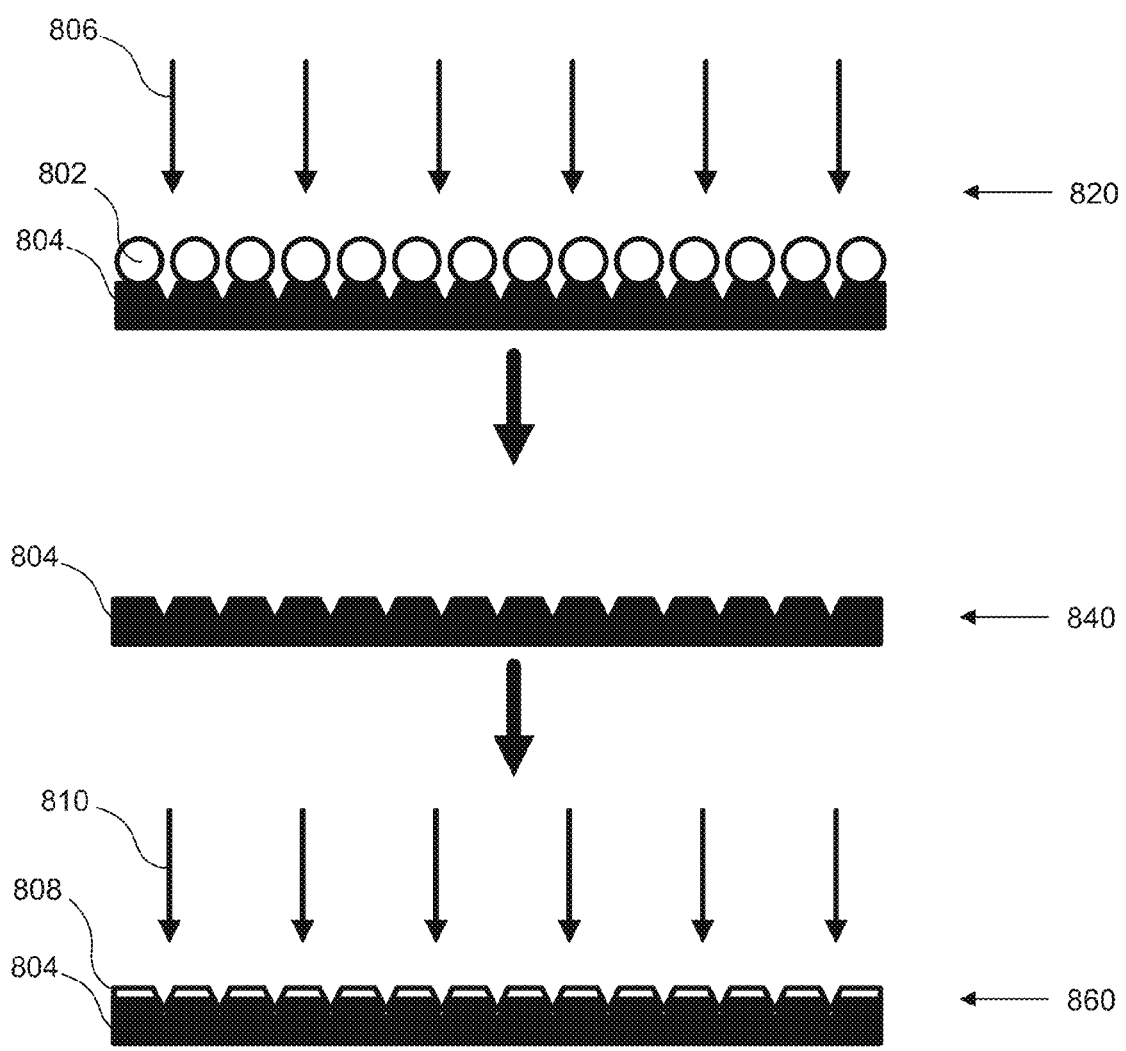
FIG. 8 shows steps in a method in which nanoparticles serve as a mask for dry, anisotropic etching to texture a substrate.

In an embodiment for fabricating nanoscale field-enhancing geometries, shown in FIG. 8, the nanoparticles 802 serve as an etch mask for dry, anisotropic etching to texture parts of the substrate 804. This textured substrate 804 can then serve as a template for film deposition (i.e., deposition of an electron-emissive material). In FIG. 8, step 820 shows the nanoparticles 802 on the substrate 804, and the etchant is shown symbolically via the arrows 806. Step 840 shows the substrate 804 after it has been etched and the nanoparticles 802 have been removed. Step 860 shows the etched substrate 804 with a film 808 deposited on it, where the film being deposited is shown symbolically via the arrows 810, and where the etched substrate 804 with the film 808 deposited on it forms the array of field emitters.

Figure 9:
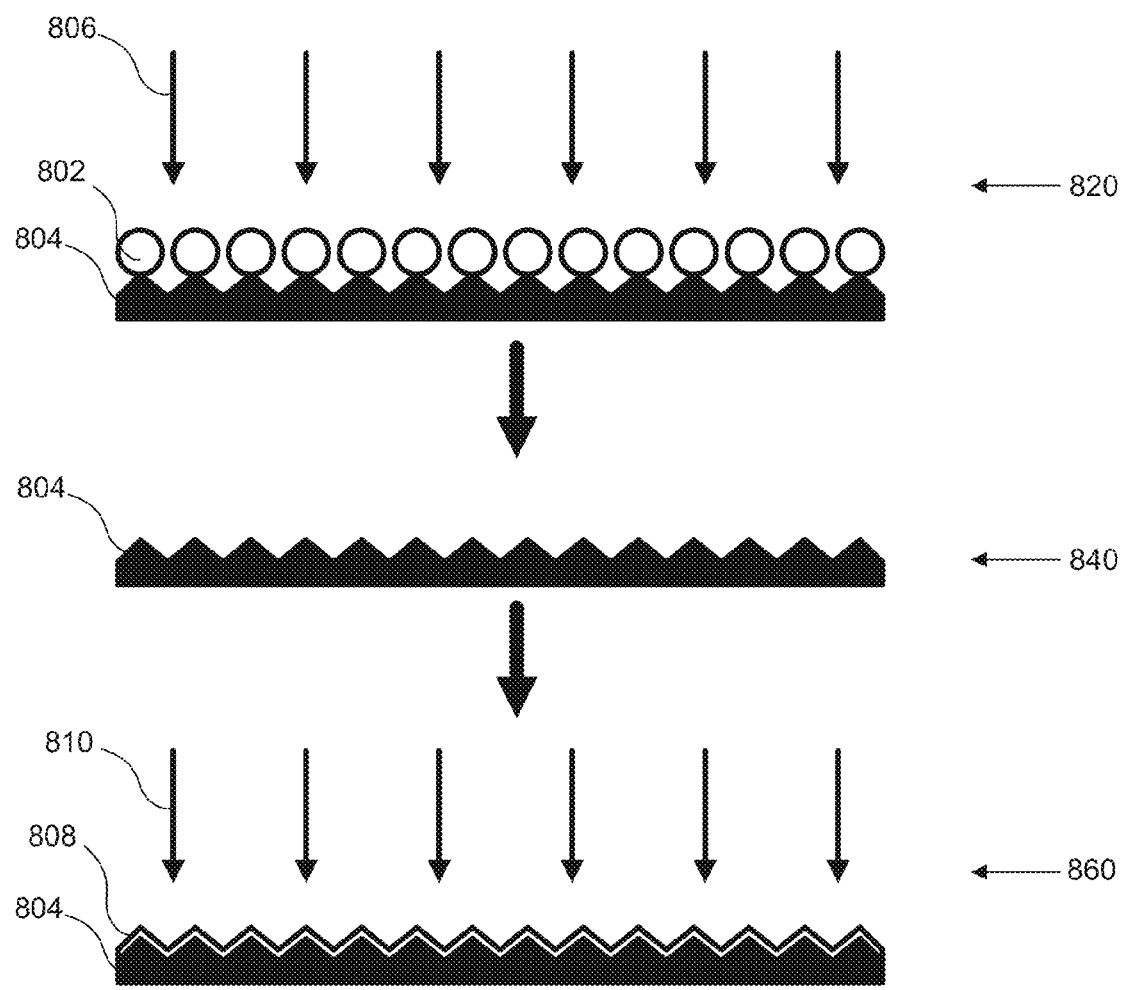
FIG. 9 shows steps in a method in which nanoparticles serve as a mask for dry, anisotropic etching to texture a substrate, producing sharp emitter tips.

FIG. 9 shows an embodiment for fabricating nanoscale field-enhancing geometries that is similar to that of FIG. 8 where the etch process is varied to produce sharper emitter tips. The sharpness of the tips can depend on the etch time, the angle and rotation of the substrate pressure during the etch process, or on other factors.

Figure 10:
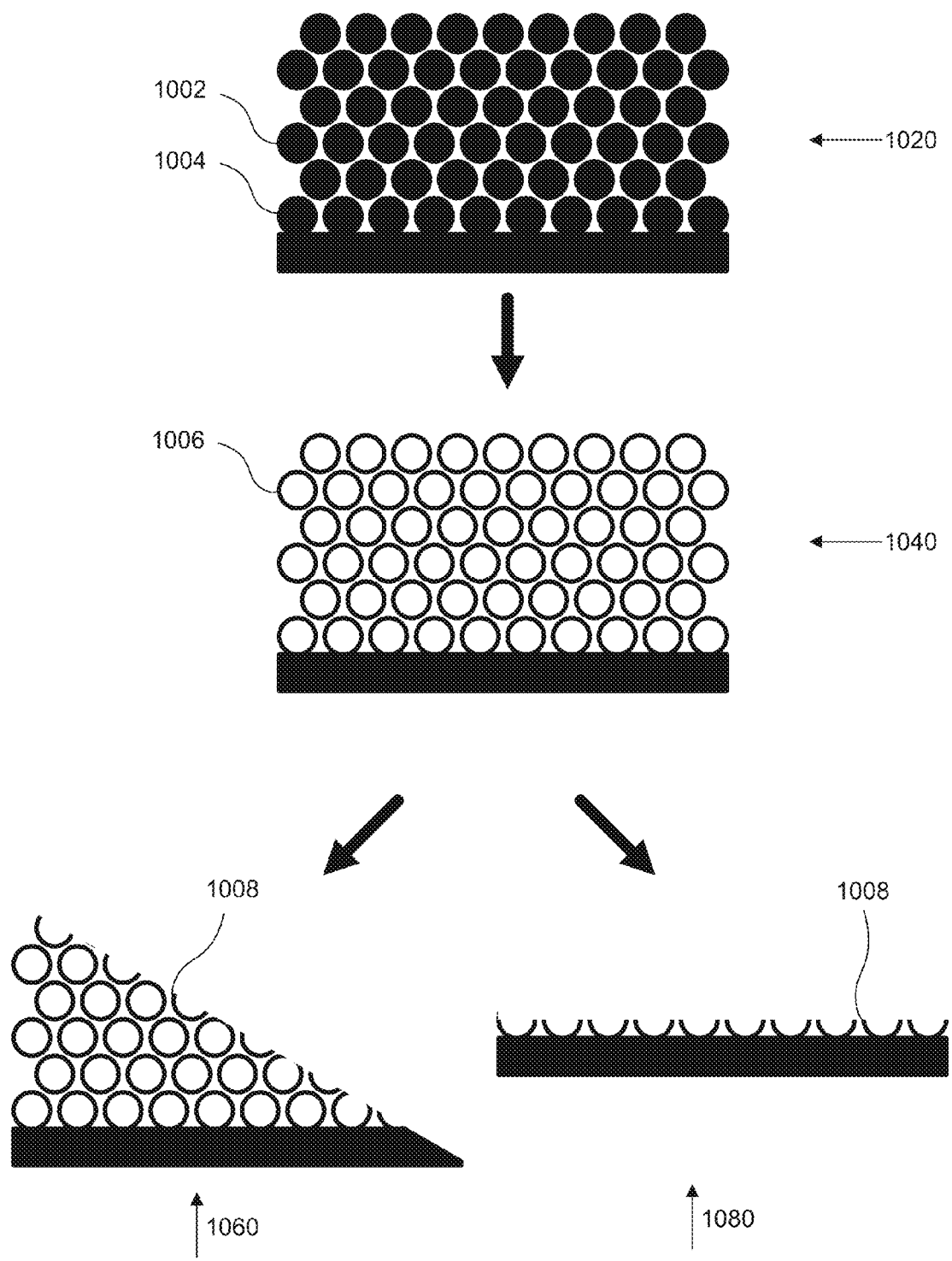
FIG. 10 shows steps in a method in which a superlattice of nanoparticles is cleaved.

In an embodiment for fabricating nanoscale field-enhancing geometries shown in FIG. 10, a porous superlattice or inverse opal of assembled nanoparticles is cut, milled, ablated, etched, chemical-mechanical polished, or otherwise cleaved. Inverse opal films are created by depositing a film onto nanoparticles in a core/shell morphology and subsequently etching the nanoparticle core. In one embodiment, the film deposited on the nanoparticles is lanthanum hexaboride ($LaB_6$), and after etching the nanoparticle core, in some embodiments the thickness of the lanthanum hexaboride ($LaB_6$) shell is less than 10 nm, but can range depending on the particular application. The nanoparticles could be coated with the shell before or after they are assembled on a substrate. In FIG. 10, step 1020 shows the superlattice 1002 of nanoparticles 1004 with a film deposited on them. Step 1040 shows the superlattice after the nanoparticle core has been etched, leaving just the film 1006 remaining, i.e. an inverse opal configuration. Steps 1060 and 1080 show different examples of the superlattice 1002 after it has been cleaved, showing that the cut could be made along any variety of (crystal) directions to give a variety of surface geometries. As can be seen from steps 1060 and 1080, cleaving produces narrow structures 1008 that can be field emitters. Such a technique of cleaving a porous structure to produce an array of field emitter is not limited to nanoparticle-generated structures as described above, but may also include nanoporous films made from nanoporous gold or silver, porous silicon (Si) or silica, zeolite, foam, bone, wood, cork, and/or artificial porous structures.

Figure 11:
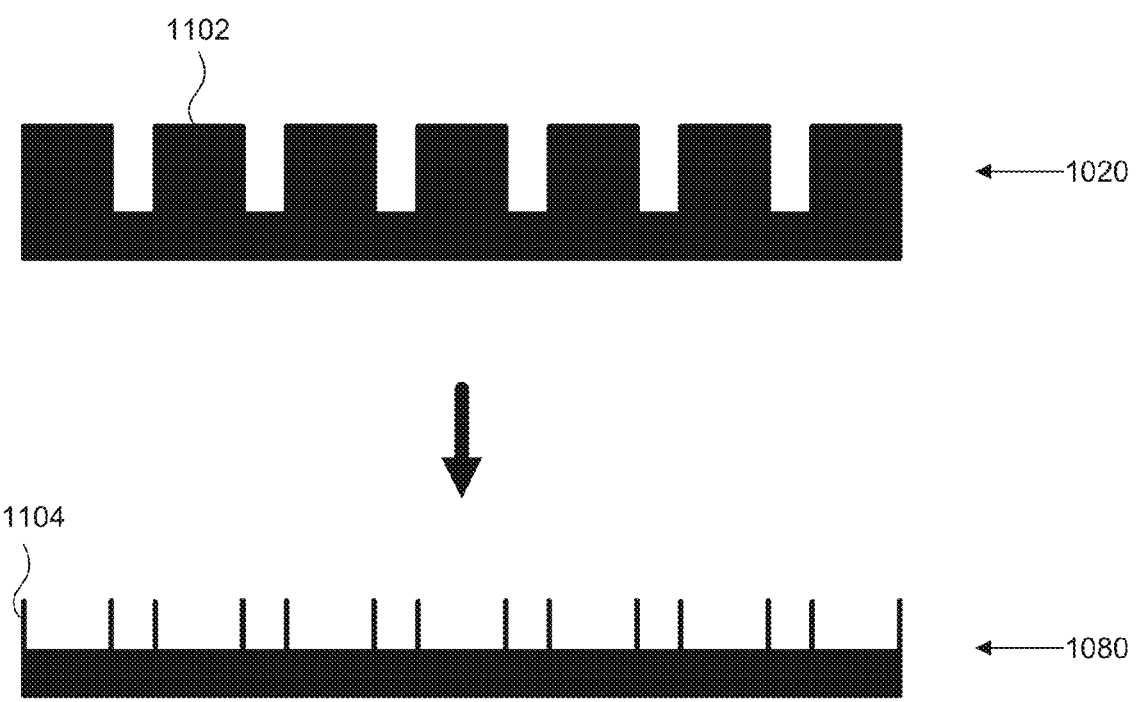
FIG. 11 shows steps in a method similar to that of FIG. 10 in which the nanoparticles are nanocubes.

Although many of the figures previously presented herein show spherical nanoparticles, the techniques as described are not limited to spherical nanoparticles but may include, for example: oriented or randomly assembled nanowires; nanocubes; two sizes of spherical nanoparticles; and/or other shapes, geometries, and/or combinations thereof. For example, as shown in FIG. 11, nanocubes 1102 prepared according to the techniques as described with respect to FIG. 10 yield sharp and narrow field emitting wires 1104.

Figure 12:
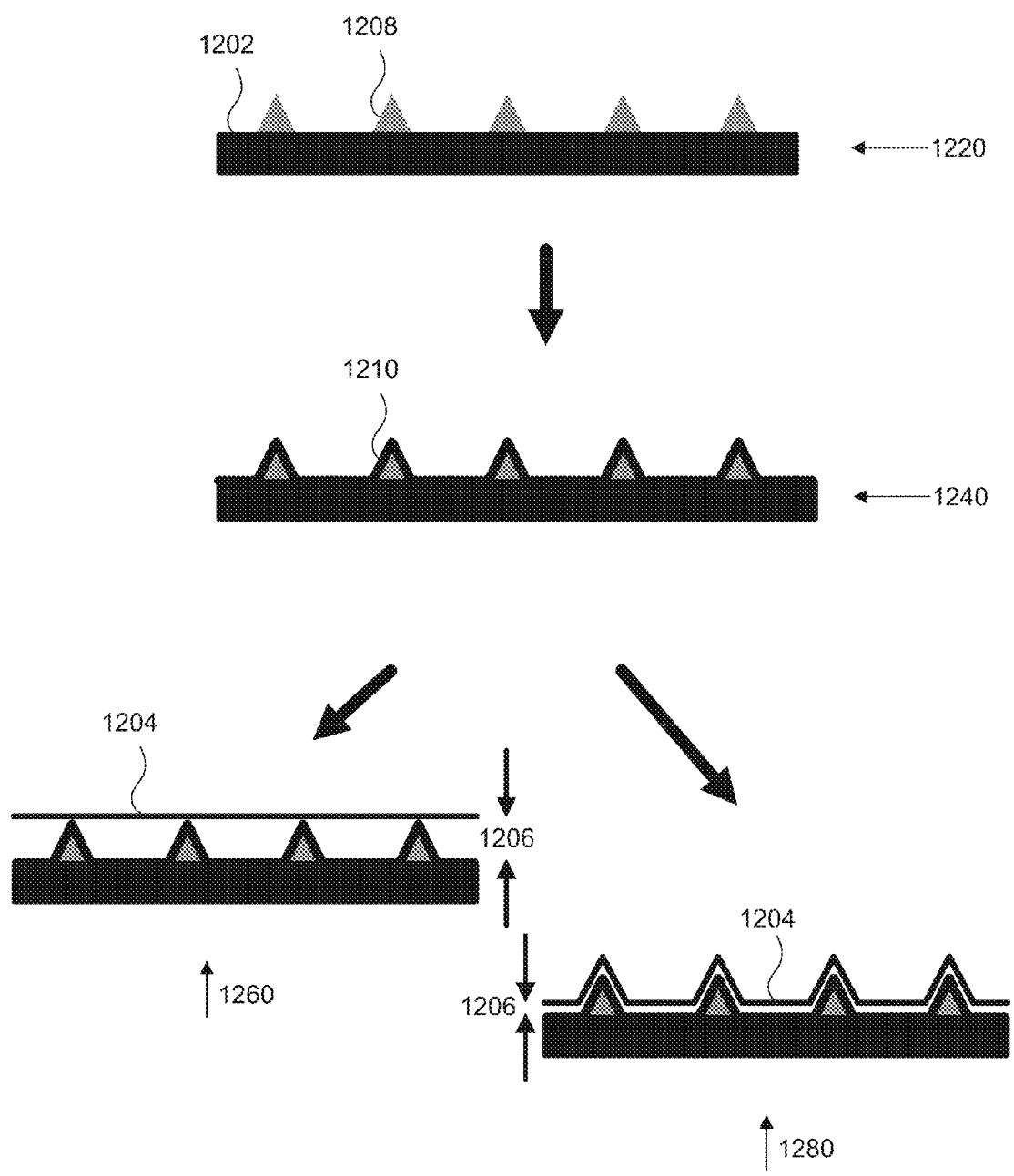
FIG. 12 shows steps in a method for assembling an electrode and a grid.

FIG. 12 shows steps (1220, 1240, 1260, 1280) in a method of fabricating a grid-electrode structure on a nano- or micron-scale. The method shown in FIG. 12 includes assembling an electrode 1202 and a grid 1204, wherein the spacing 1206 between the electrode and the grid is on a sub-micron scale. In step 1220 of FIG. 12, nanoscale field emitters 1208 are deposited on the electrode 1202. In step 1240, a dielectric layer 1210 is deposited conformally on the electrode and field emitters. The dielectric layer 1210 can be deposited conformally by CVD (e.g. $SiO_2$, $Si_3N_4$), sputter coating (e.g. $SiO_2$, $Si_3N_4$), ALD (e.g. $SiO_2$, $Al_2O_3$, $ZrO_2$, $HfO_2$), or via a different method.

The grid 1204 is then applied in one of a number of ways illustrated by steps 1260 and 1280, where in both cases, the dielectric layer 1210 insulates the grid 1204 from the electrode 1202. In step 1260, the grid is deposited as a self-supporting sheet such as graphene. In step 1280, the grid is deposited as a conformal layer, where in this embodiment a pulsed CVD or ALD might be used to deposit a layer of a conformal conductor such as a metal nitride (NiN, WN, TiN, etc.) or a metal (Cu, Pt, W), where in some embodiments the layer has a nanoscale thickness.

In some embodiments, the dielectric layer 1210 is deposited in the same chamber, such as in an e-beam evaporator, as the field emitters 1208. In such an embodiment the dielectric layer 1210 acts as a protective capping layer for reactive/non-air-stable materials such as Cs, BaO, Na, etc. In some embodiments where the field emitter 1208 is oxygen sensitive, the dielectric layer 1210 includes silicon nitride or another dielectric whose composition is selected so that the field emitter 1208 does not react with the dielectric layer 1210.

Figure 13:
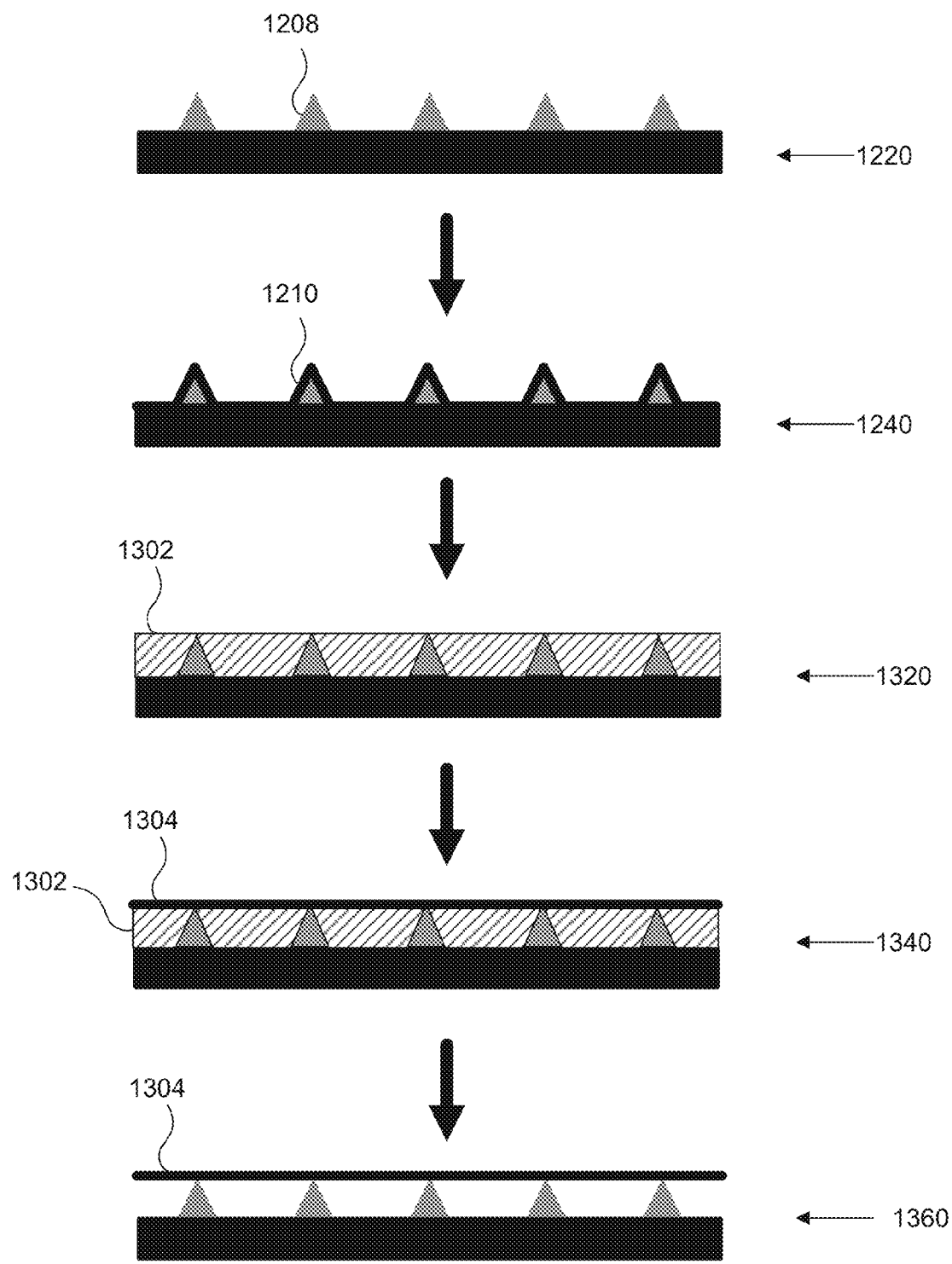
FIG. 13 shows steps in a method for assembling an electrode and a grid using a sacrificial layer.

In an embodiment shown in FIG. 13, a method similar to that of FIG. 12 is employed with an additional step of the deposition of a sacrificial layer 1302 to support the grid 1304. Such a method is used in an embodiment where the grid is not self-supporting during its deposition, such as a metal film grid. In such an embodiment the grid will be "floating" similar to the grid shown in step 1260 of FIG. 12.

In FIG. 13, the first two steps (1220, 1240) are the same as the first two steps of FIG. 12. Step 1320 shows the deposition of the sacrificial layer 1302, step 1340 shows the deposition of the grid 1304, and step 1360 shows the removal of the sacrificial layer 1302.

In some embodiments the sacrificial layer 1302 in FIG. 13 is a spin/spray-coated resist or organic, where in some embodiments thin layers (less than about 100 nm) may be achieved by spinning a layer and dry-etching or milling it down to the tops of the field emitters 1208. For example, oxygen plasma will etch most electron beam and photoresists at a very reliable and controlled rate.

In step 1360, where the sacrificial layer 1302 is removed, the layer 1302 can be removed by wet or dry etching. In some embodiments, such as if the layer 1302 is not conductive, has high dielectric breakdown strength (e.g. HSQ–>$SiO_2$), and/or will not interfere with device performance, the layer 1302 is not removed. Removal of the layer 1302 is facilitated in some embodiments by pinholes in the grid 1304 that allow the sacrificial layer etchant to penetrate the grid to reach the layer 1302.

Figure 14:
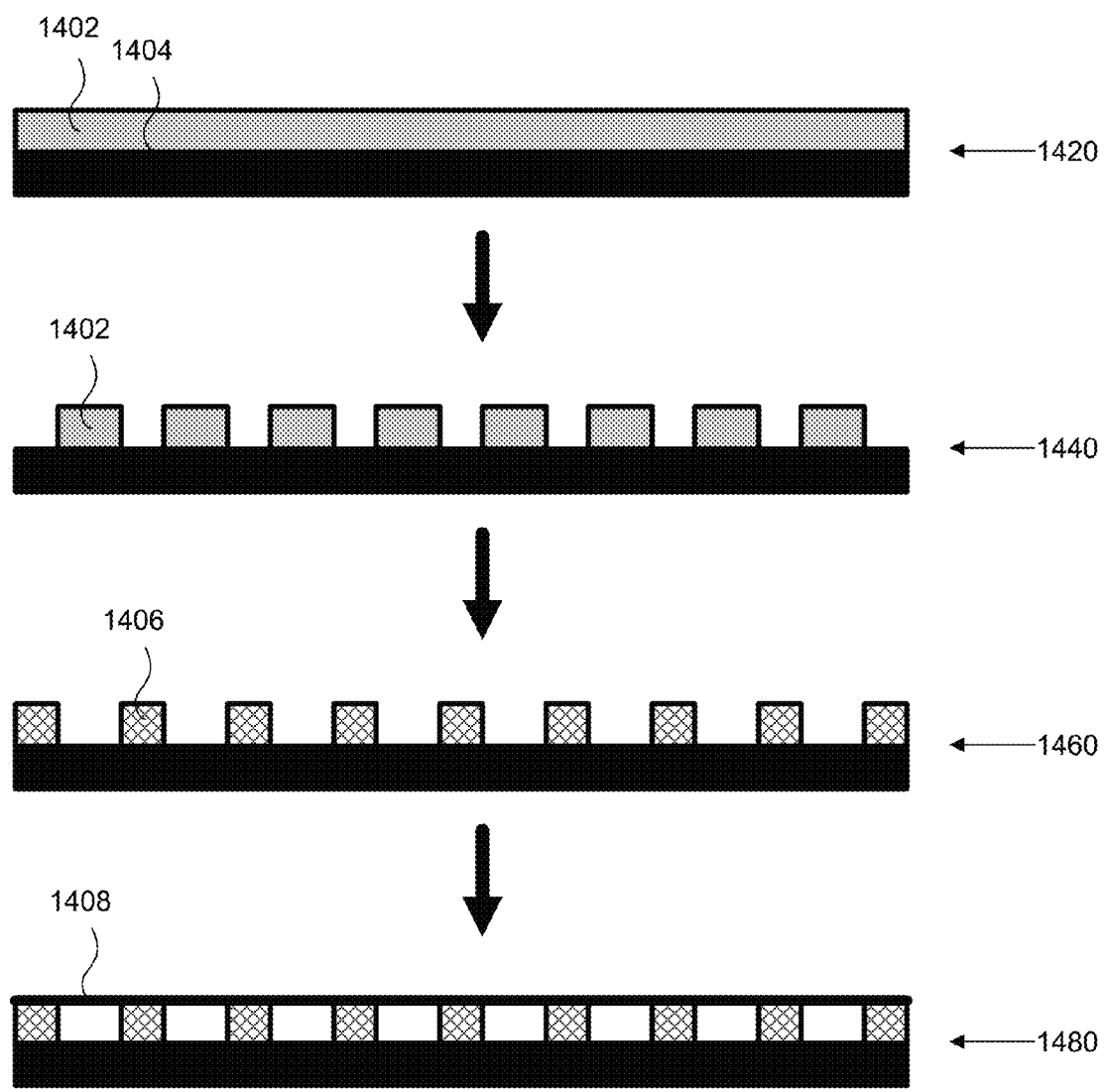
FIG. 14 shows steps in a method for line-of sight deposition of dielectric spacers that support a grid.

An embodiment illustrated in FIG. 14 shows an example of the non-conformal (line-of sight) deposition of dielectric spacers that support the grid. In FIG. 14, a resist or other sacrificial layer 1402 is deposited on a substrate 1404 in a first step 1420. The resist 1402 is then patterned in step 1440. In step 1460, a dielectric 1406 is deposited in a line-of-sight manner via e-beam evaporation and the remaining resist 1402 is removed. The grid 1408 is deposited in step 1408.

Figure 15:
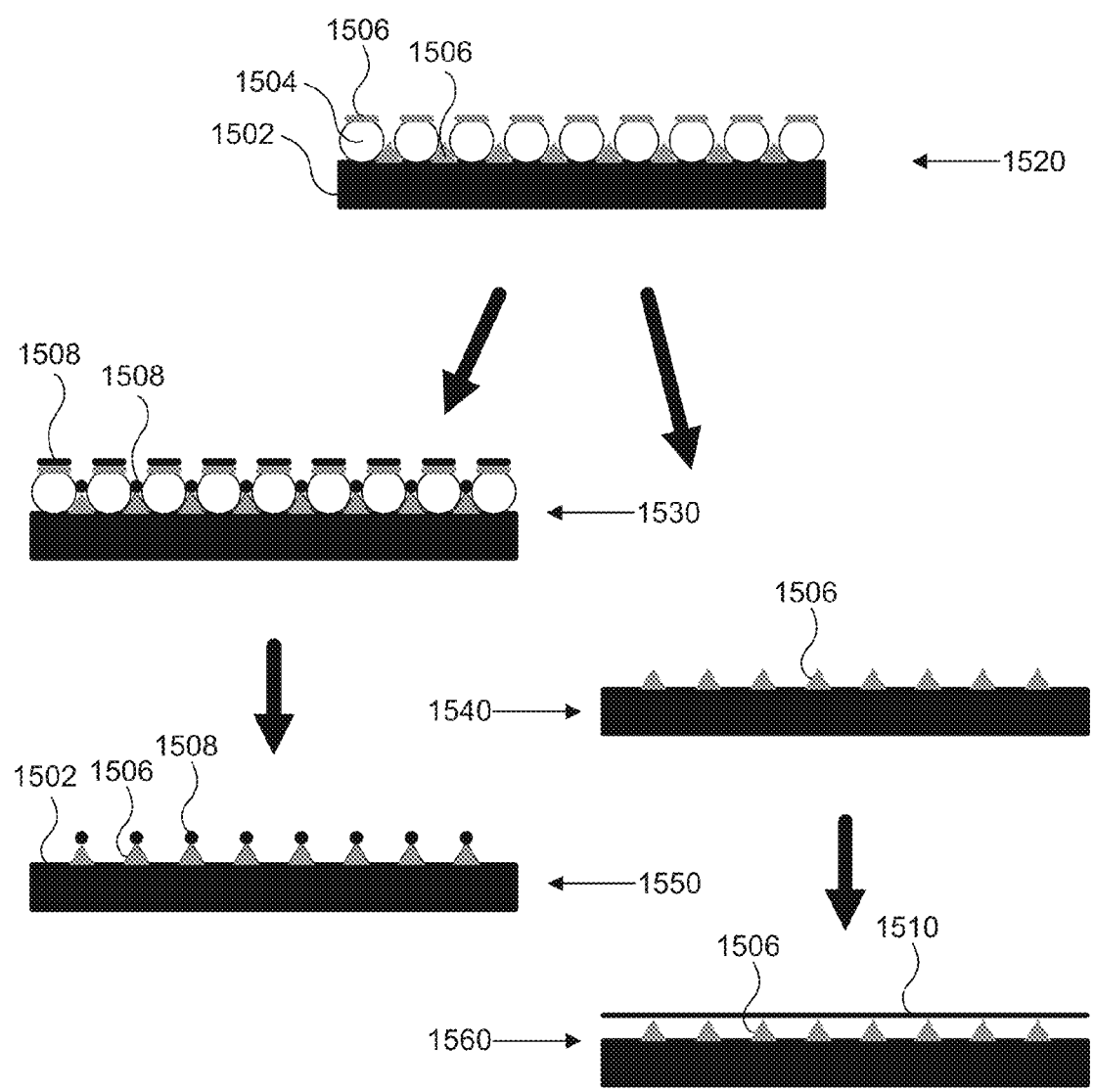
FIG. 15 shows steps in a method for line-of sight deposition of dielectric spacers that support a grid, where nanoparticles are used as a mask.

The method described with respect to FIG. 14 may be varied by using nanoparticles as a mask instead of the patterned sacrificial layer 1402. FIG. 15 shows examples of embodiments that use this technique. Step 1520 shows a substrate 1502 with nanoparticles 1504, with a dielectric 1506 evaporated on the nanoparticles and in the gaps between the nanoparticles.

In one embodiment shown in FIG. 15 (left pathway and steps 1530, 1550), step 1530 shows a metal grid 1508 evaporated (for example, via line-of-sight evaporation) on the dielectric, followed by step 1550, which shows the substrate 1502, dielectric 1506, and metal grid 1508 after the nanoparticles 1504 have been removed. Electrically addressing such a structure is achieved by, for example, covering the structure with a layer of graphene, or by placing nanowires or other elongated geometry to allow addressing away from the active area of the device.

In another embodiment shown in FIG. 15 (right pathway and steps 1540, 1560), step 1540 shows the dielectric 1506 that remains after the nanoparticles 1504 have been removed, and step 1560 shows this remaining dielectric 1506 after a grid 1510 has been deposited.

Figure 16:
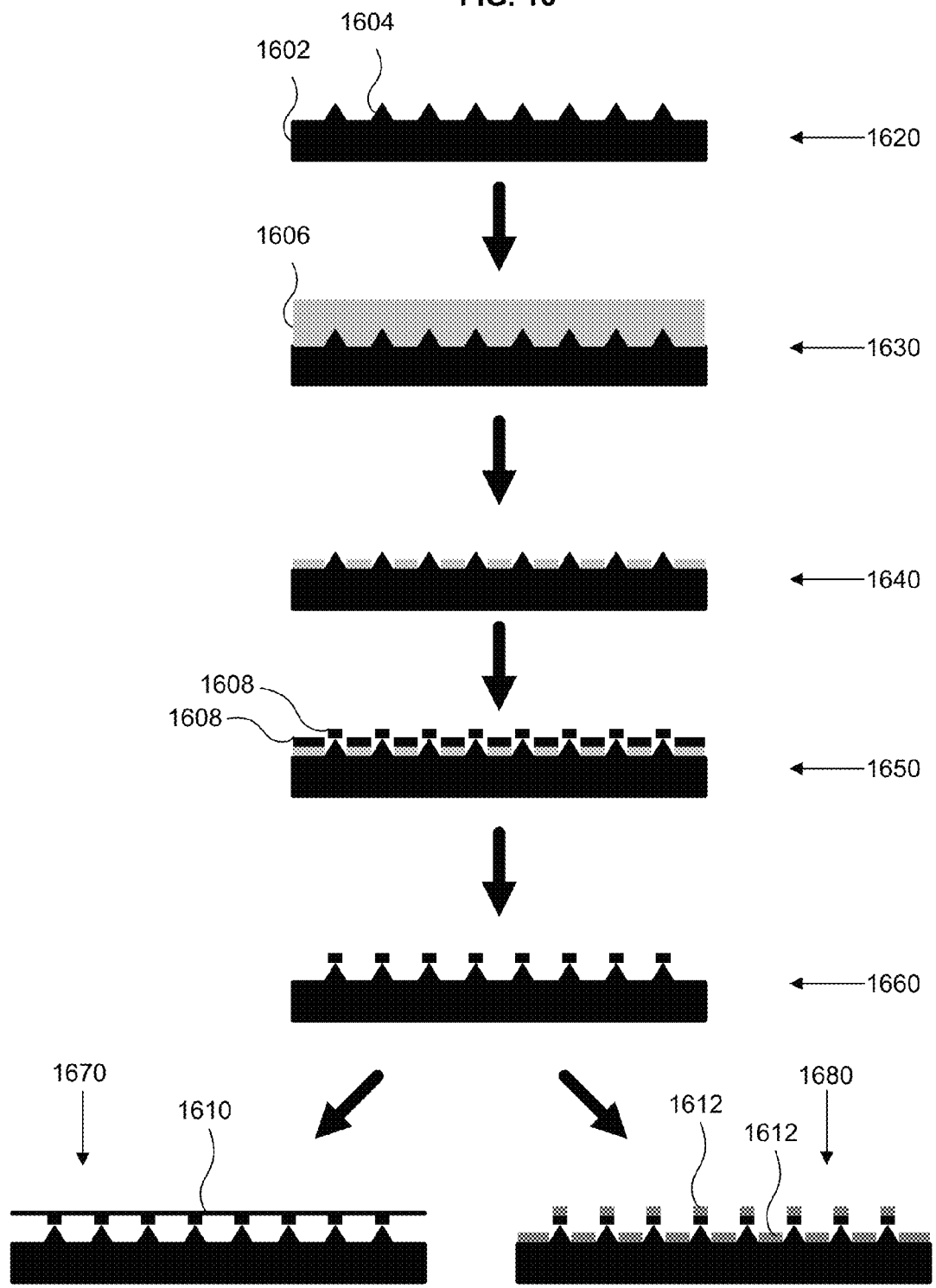
FIG. 16 shows steps in a method for using a resist to fabricate a grid-electrode structure.

FIG. 16 shows an embodiment related to the embodiments shown in FIGS. 13-15, where in FIG. 16 the thickness of the resist is less than a height of the field emitters, leaving space between the resist and the top of the field emitters. FIG. 16 shows steps (1620, 1630, 1640, 1650, 1660, 1670, 1680) in a method of fabricating a grid-electrode structure on a nano- or micron-scale. In step 1620 of FIG. 16, nanoscale field emitters 1604 are deposited on the substrate 1602. In step 1630, a resist or other sacrificial layer 1606 is deposited on the substrate 1602 and the nanoscale field emitters 1604. In step 1640, the resist 1606 is etched, for example via an oxygen plasma etch. In step 1650, a dielectric material 1608 is deposited on the resist 1606. In step 1660, the resist 1606 is removed. The grid can be applied in one of two ways, as shown by alternative steps 1670 and 1680, where in step 1670 the grid 1610 is substantially self-supporting, and where in step 1680 the grid 1612 is deposited as a film.

In embodiments in which nanoparticles that are used as a mask or template for deposition of field-enhancing nanotexture are not removed, in some embodiments they can be used to control electrode-grid spacing. In an embodiment shown in FIG. 17 the nanoparticles 1702 act as a dielectric spacer between the substrate 1704 (i.e. the electrode) and the grid 1706, where in this embodiment the nanoparticles 1702 comprise a dielectric that is selected according to its dielectric breakdown strength. The grid 1706 can include a graphene or carbon nanotube mesh or other 2D layer.

Figure 17:
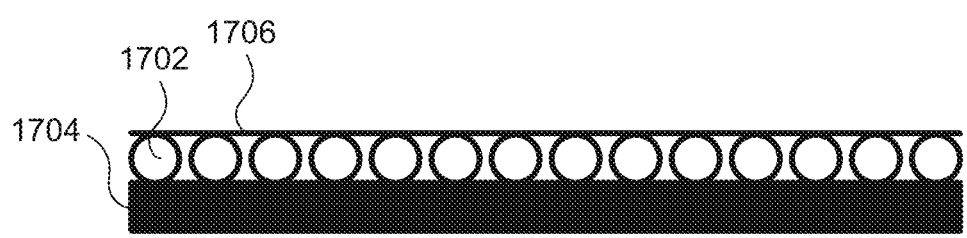
FIG. 17 is a schematic showing nanoparticles that act as a dielectric spacer between a substrate and a grid.
Figure 18:
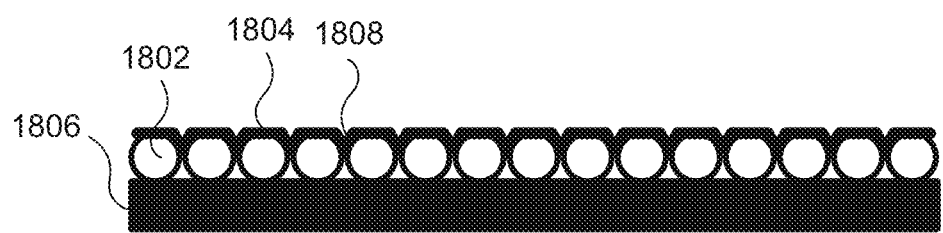
FIG. 18 is a schematice similar to that of FIG. 17 where the nanoparticles are spaced closely and the grid is deposited on them.

FIG. 18 shows an embodiment similar to that of FIG. 17 where the nanoparticles 1802 are spaced close enough together that a grid 1804 can be deposited/grown on the particles. In this embodiment, where an electric field is created between the substrate 1806 and the grid 1804, field enhancement can be produced in the regions 1808 between the nanoparticles.

Figure 19:
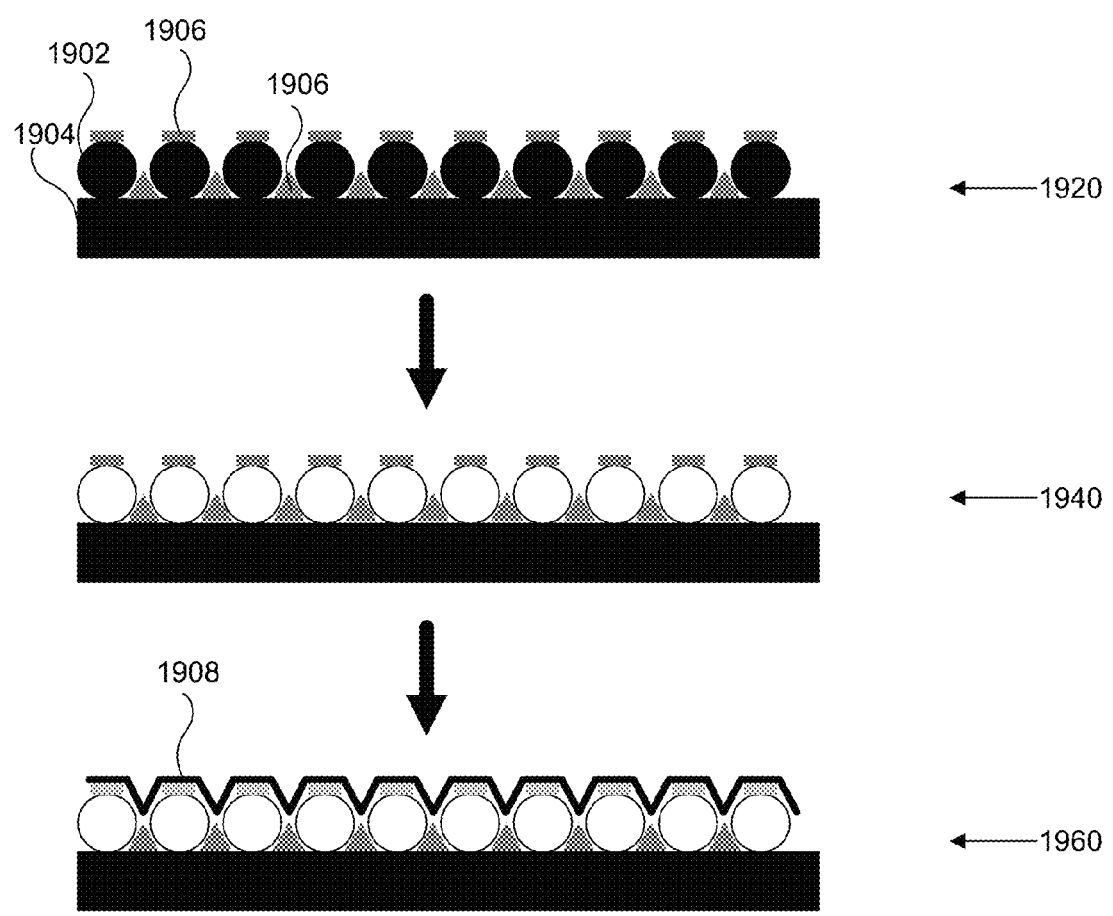
FIG. 19 shows steps of a method for fabricating an electrode and grid with a relatively high dielectric breakdown strength between them.

FIG. 19 illustrates one embodiment of a method for fabricating an electrode and grid with a relatively high dielectric breakdown strength between them. Step 1920 shows the nanoparticles 1902 assembled on a substrate 1904. The nanoparticles are coated with a dielectric, not shown, which may be done before the nanoparticles are assembled on the substrate or after. A conductor 1906 is evaporated on the nanoparticles to create the field emitters. Step 1940 shows the assembly after the nanoparticles 1902 have been etched, creating an "inverse opal" defined by the nanoparticles. Step 1960 shows the assembly after the deposition of a grid 1908. In some embodiments where the grid 1908 contacts one or more of the field emitters to create an electrical short, a pulsed voltage may be applied to the grid to cause large electrical currents to flow through the electrical short and burn out the contact point.

Figure 20:
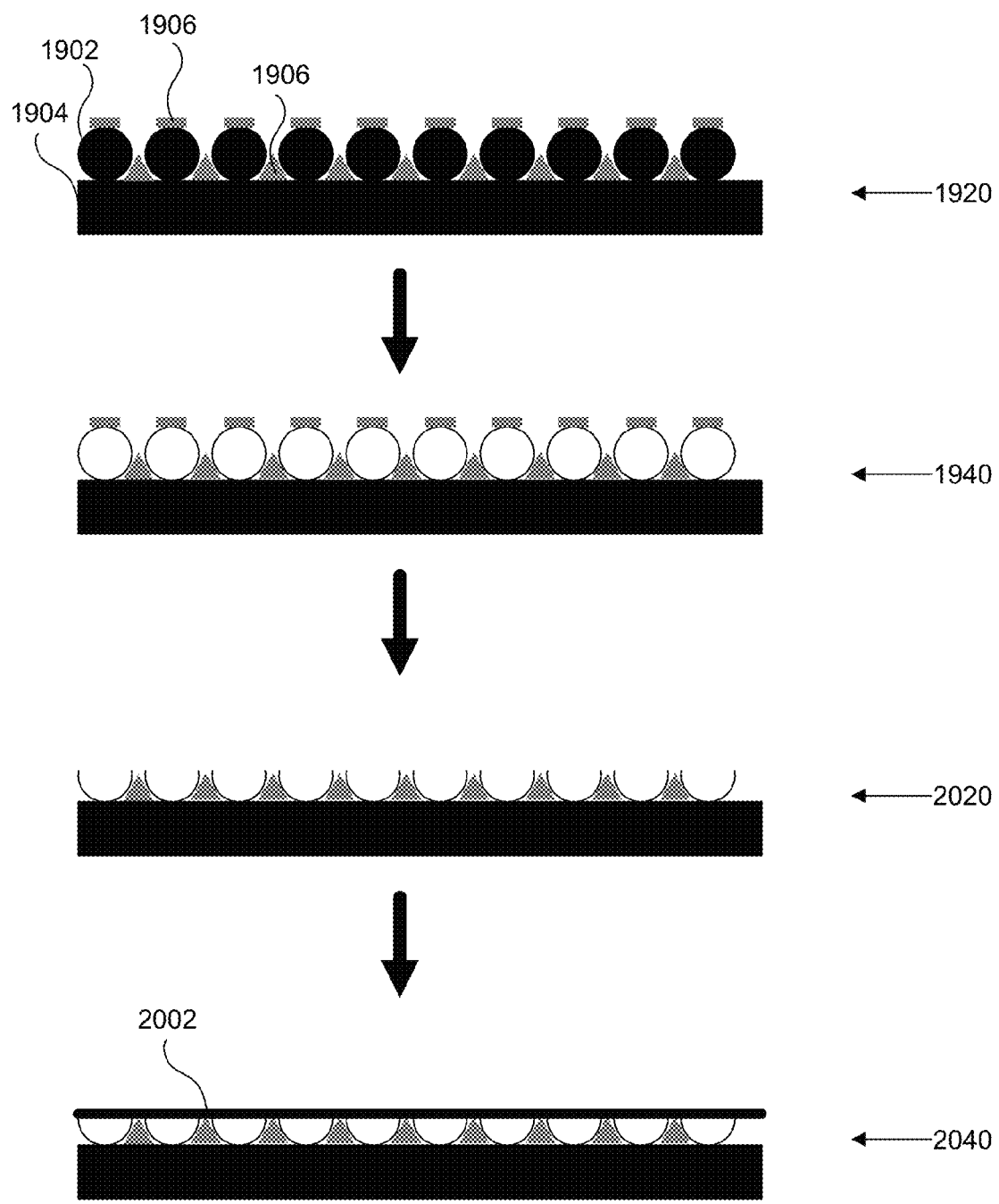
FIG. 20 shows steps of a method similar to that of FIG. 20, but with an added step of etching nanoparticles.

In an embodiment shown in FIG. 20 the nanoparticles are etched before deposition of the grid to adjust the grid-electrode spacing to a fraction of the thickness of the nanoparticles. The first two steps shown in FIG. 20, steps 1920 and 1940, are the same as the first two steps shown in FIG. 19. In step 2020 the nanoparticles are etched, and in step 2040 the grid 2002 is deposited on the nanoparticles.

Figure 21:
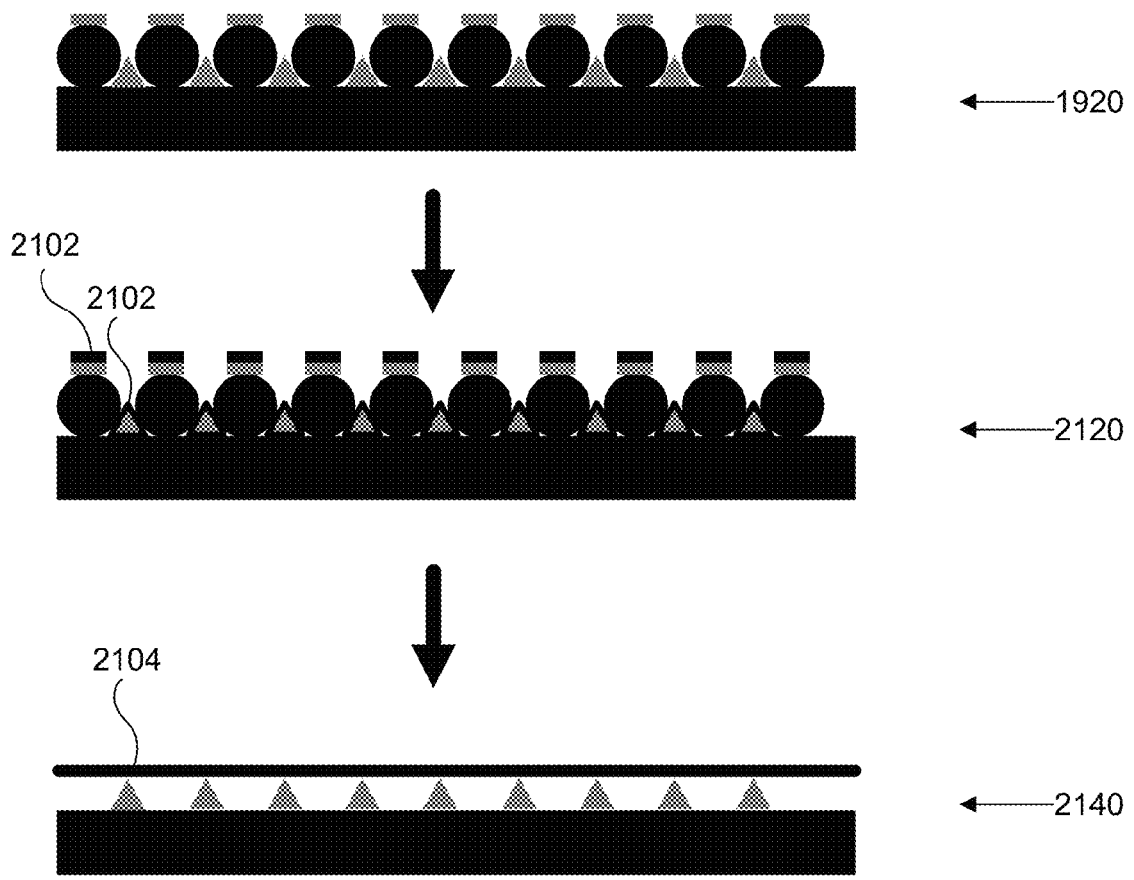
FIG. 21 shows steps of a method where nanoparticles are used as a deposition mask for a dielectric after a field emitter is deposited.

In an embodiment shown in FIG. 21, nanoparticles are used as a deposition mask for a dielectric after a field emitter is deposited. The first step of FIG. 21, step 1920, is the same as the first step of FIGS. 19 and 20. In step 2120, a dielectric 2102 is evaporated. In step 2140, the nanoparticles are removed and the grid 2104 is deposited.

Figure 22:
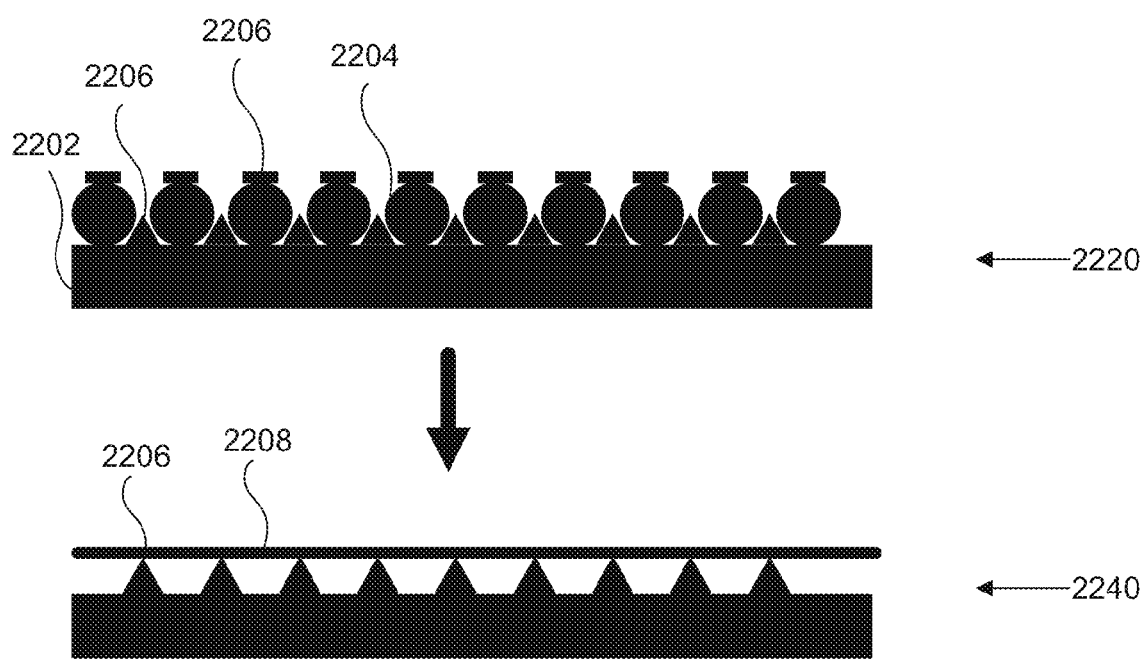
FIG. 22 shows steps of a method where nanoparticles are used as a deposition mask for a dielectric that supports a grid.

In an embodiment shown in FIG. 22, in a first step 2220, nanoparticles 2204 are deposited on a substrate 2202, and a dielectric 2206 is deposited on the nanoparticles and in the gaps between the nanoparticles. In a second step 2240 the nanoparticles are removed leaving just the portions of dielectric 2206 that were deposited between the nanoparticles, and a grid 2208 is deposited on the dielectric 2206. Such an embodiment may be used, for example, to place a grid very close to an anode in a vacuum electronics device. However, an embodiment such as that shown in FIG. 22 may also be used as a cathode with a grid placed very close to the cathode.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of forming an array of field emitters on a substrate, the method comprising:
    assembling an array of nanoparticles on the substrate; and
    depositing a material on the array of nanoparticles to form the array of field emitters, wherein depositing a material on the array of nanoparticles to form the array of field emitters includes:
        depositing a first material on the array of nanoparticles to form an array of nanotips; and
        depositing an electron-emissive material on the array of nanotips to form the array of field emitters.

2. The method of claim 1 further comprising:
    removing the nanoparticles via one of dry or wet etching, milling, mechanical abrasion, and solution-phase sonication.

3. The method of claim 1 wherein depositing a material on the array of nanoparticles to form the array of field emitters includes:

depositing an electron emissive material on the array of nanoparticles to form the array of field emitters.

4. The method of claim 1 wherein the first material includes at least one of gold (Au), titanium (Ti), tungsten (W), tantalum (Ta), and molybdenum (Mo).

5. The method of claim 1 wherein the electron-emissive material includes cerium hexaboride ($CeB_6$).

6. The method of claim 1 wherein the array of field emitters is characterized by a sharpness, the method further comprising:
controlling the sharpness of the field emitters by controlling an angle of incidence of the deposited material.

7. The method of claim 1 wherein the nanoparticles are substantially spherical, and the array of field emitters form a substantially hexagonal sub-array around each nanoparticle.

8. The method of claim 1 wherein the electron-emissive material includes lanthanum hexaboride ($LaB_6$).

9. The method of claim 1, further comprising:
depositing a dielectric material on the array of nanoparticles and on the array of field emitters; and
removing the nanoparticles.

10. The method of claim 9, further comprising depositing a grid on the dielectric material, wherein the distance between the substrate and the grid is on a sub-micron scale.

11. The method of claim 10 wherein depositing the grid includes depositing at least one of graphene and carbon nanotube mesh.

12. A method of forming an array of field emitters on a substrate, the method comprising:
assembling nanoparticles on the substrate, wherein the nanoparticles forms an etch mask;
etching the substrate according to the etch mask; and
depositing an electron-emissive material on the etched substrate.

13. The method of claim 12 wherein depositing the electron-emissive material on the etched substrate forms an array of field emitters characterized by a shape, and wherein etching the substrate according to the etch mask occurs over an etch time, and further comprising: selecting the etch time according to a field emitter shape.

14. The method of claim 12 wherein depositing the electron-emissive material on the etched substrate forms an array of field emitters characterized by a shape, and wherein etching the substrate according to the etch mask occurs at an angle and rotation of the substrate, and further comprising:
selecting the angle and rotation of the substrate according to a field emitter shape.

15. The method of claim 12 wherein the electron-emissive material includes lanthanum hexaboride ($LaB_6$).

16. The method of claim 12 wherein the electron-emissive material includes cerium hexaboride ($CeB_6$).

17. The method of claim 12 wherein the electron-emissive material includes a refractory material.

18. A method comprising:
assembling a superlattice of nanoparticles on a substrate;
depositing a film on each of the nanoparticles in the superlattice before assembling the superlattice of nanoparticles on the substrate;
etching the nanoparticles in the superlattice to produce an inverse opal; and cleaving the inverse opal to produce an array of field emitters.

19. The method of claim 18 wherein cleaving includes at least one of cutting, milling, ablating, etching, and chemical-mechanical polishing.

20. The method of claim 18 wherein the superlattice of nanoparticles has a crystal structure, and further comprising: selecting a crystal direction corresponding to the inverse opal; and cleaving the inverse opal along the selected crystal direction.

21. The method of claim 18 wherein the film includes lanthanum hexaboride ($LaB_6$).

22. The method of claim 18 wherein the film includes cerium hexaboride ($CeB_6$).

23. The method of claim 18 wherein the film includes a refractory material.

24. The method of claim 18 wherein the inverse opal has a shell thickness that is between 5 nm and 50 nm.

25. The method of claim 18 wherein at least a portion of the nanoparticles in the superlattice of nanoparticles are spherical.

26. The method of claim 18 wherein at least a portion of the nanoparticles in the superlattice of nanoparticles are cubic.

27. A method comprising:
fabricating an array of dielectric supports on a substrate, wherein fabricating the array of dielectric supports includes:
depositing an array of nanoparticles on a substrate, wherein the array of nanoparticles is arranged with an array of gaps between the nanoparticles;
depositing a dielectric material on the substrate in the array of gaps; and
removing the nanoparticles; and
depositing a grid on the array of dielectric supports, wherein a distance between the substrate and the grid is on a sub-micron scale.

28. A method comprising:
depositing an array of nanoparticles on a substrate, wherein the array of nanoparticles includes a dielectric that is selected according to its dielectric breakdown strength; and
depositing a grid on the array of nanoparticles, wherein the grid includes at least one of graphene and a carbon nanotube mesh, wherein a distance between the substrate and the grid is on a sub-micron scale.

29. The method of claim 28 wherein the array of nanoparticles is substantially closely packed, and wherein depositing a grid on the array of nanoparticles includes:
depositing or growing a film on the array of nanoparticles.

30. A method of forming an array of field emitters on a substrate, the method comprising:
assembling an array of nanoparticles on the substrate; and
depositing a material on the array of nanoparticles to form the array of field emitters;
wherein the array of field emitters is characterized by a sharpness, the method further comprising:
controlling the sharpness of the field emitters by controlling an angle of incidence of the deposited material.

31. The method of claim 30 further comprising:
removing the nanoparticles via one of dry or wet etching, milling, mechanical abrasion, and solution-phase sonication.

32. The method of claim 30 wherein depositing a material on the array of nanoparticles to form the array of field emitters includes:
depositing an electron emissive material on the array of nanoparticles to form the array of field emitters.

33. The method of claim 30 wherein depositing a material on the array of nanoparticles to form the array of field emitters includes:
depositing a first material on the array of nanoparticles to form an array of nanotips, wherein the first material includes at least one of gold (Au), titanium (Ti), tungsten (W), tantalum (Ta), and molybdenum (Mo); and depositing an electron-emissive material on the array of nanotips to form the array of field emitters.

34. The method of claim 33 wherein the electron-emissive material includes cerium hexaboride ($CeB_6$) or lanthanum hexaboride ($LaB_6$).

35. The method of claim 30 wherein the nanoparticles are substantially spherical, and the array of field emitters form a substantially hexagonal sub-array around each nanoparticle.

* * * * *

UNITED STATES PATENT AND TRADEMARK OFFICE
CERTIFICATE OF CORRECTION

| | |
|---|---|
| PATENT NO. | : 9,548,180 B2 |
| APPLICATION NO. | : 14/947773 |
| DATED | : January 17, 2017 |
| INVENTOR(S) | : Mankin et al. |

It is certified that error appears in the above-identified patent and that said Letters Patent is hereby corrected as shown below:

In the Claims

Column 9, Line 32, Claim 12:
"nanoparticles forms an etch mask;"

Should read:
--nanoparticles form an etch mask;--

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*